United States Patent
Zhang et al.

(10) Patent No.: US 10,693,485 B1
(45) Date of Patent: Jun. 23, 2020

(54) ADAPTIVE BACKGROUND ADC CALIBRATION

(71) Applicant: Avago Technologies International Sales Pte. Limited, Singapore (SG)

(72) Inventors: Mo Maggie Zhang, Irvine, CA (US); Cy Chen, Irvine, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 0 days.

(21) Appl. No.: 16/361,807

(22) Filed: Mar. 22, 2019

(51) Int. Cl.
*H03M 1/10* (2006.01)
*H03H 21/00* (2006.01)
*H04L 25/03* (2006.01)
*H04B 1/10* (2006.01)

(52) U.S. Cl.
CPC ...... *H03M 1/1028* (2013.01); *H03H 21/0012* (2013.01); *H04B 1/10* (2013.01); *H04L 25/03057* (2013.01); *H03H 2021/0092* (2013.01)

(58) Field of Classification Search
CPC .... H03M 1/12; H03M 1/1215; H03M 1/0626; H03M 1/1009; H03M 1/002; H03M 1/0617; H03M 1/0631; H03M 1/0634; H03M 1/1225; H03M 1/1028; H03M 1/1019; H03M 1/121; H03M 1/128; H03M 1/44
USPC .......................... 341/118–120, 139, 140, 155
See application file for complete search history.

(56) References Cited

U.S. PATENT DOCUMENTS

| | | | | |
|---|---|---|---|---|
| 3,879,664 A | * | 4/1975 | Monsen | H04L 1/04 375/232 |
| 4,774,499 A | * | 9/1988 | Mapleston | H03M 1/0675 324/99 D |
| 6,002,713 A | * | 12/1999 | Goldstein | H04L 25/03012 375/222 |
| 7,382,296 B2 | * | 6/2008 | Delanghe | H03M 1/183 330/129 |
| 7,446,685 B1 | * | 11/2008 | Kikugawa | G11B 20/10009 341/118 |
| 9,780,800 B1 | * | 10/2017 | Satoskar | H03M 1/0607 |
| 2007/0205934 A1 | * | 9/2007 | Buisson | H03M 1/1019 341/155 |
| 2008/0198048 A1 | * | 8/2008 | Klein | H03M 1/186 341/110 |
| 2012/0249348 A1 | * | 10/2012 | Siragusa | H03M 1/1033 341/110 |
| 2013/0002345 A1 | * | 1/2013 | Saito | H03H 21/0012 327/551 |
| 2013/0241753 A1 | * | 9/2013 | Nozaki | H03M 1/0626 341/118 |
| 2017/0374459 A1 | * | 12/2017 | Satoskar | G06F 3/165 |

* cited by examiner

Primary Examiner — Linh V Nguyen
(74) Attorney, Agent, or Firm — Xsensus LLP

(57) ABSTRACT

An electronic device is disclosed that includes an analog-to-digital converter circuit, an adaptive filter circuit coupled to the analog-to-digital converter circuit to correct one or more circuit impairments in the analog-to-digital converter circuit, a training signal generator circuit to generate training signals, and an amplitude detector circuit configured to suspend generation of the training signals and cause the adaptive filter circuit to suspend adaptation when the input signal is above a predetermined threshold.

20 Claims, 8 Drawing Sheets

ADAPTIVE BACKGROUND ADC CALIBRATION

BACKGROUND

Field

This disclosure relates to the field of analog-to-digital converters, devices, components and methods.

Description of the Related Art

An analog-to-digital converter (ADC) is an electronic component that converts an analog voltage or current input to a digital output representing the magnitude of the voltage or current. ADCs are used in many modern electronic devices including video, voice and music recorders; mobile phones; computers; communications equipment; scientific instruments and data acquisition systems.

The flash ADC is a well-known type of analog-to-digital converter. For an N-bit converter, a flash ADC circuit typically uses $2^N-1$ comparators, a resistive-divider (resistor ladder) with $2^N$ resistors to provide a reference voltage for each comparator, and an encoder to convert the comparator outputs (in the so-called "unary" or "thermometer" code) into a binary value. Because of the number of components required, flash ADCs are typically used in applications that require very high conversion rates, low latency, and relatively low resolution (up to about 7 or 8 bits).

A related type of ADC is the so-called pipelined ADC, which employs multiple stages, where each stage typically includes a sample-and-hold circuit, a low resolution flash ADC (herein referred to as a sub-ADC), a digital-to-analog converter (herein referred to as a sub-DAC), a summing circuit, and an amplifier (the last stage of a pipelined ADC, however, may only include a sub-ADC). In many implementations, the sample-and-hold circuit, the digital-to-analog converter, the summing circuit, and the amplifier are incorporated into a single circuit block referred to as a multiplying digital-to-analog converter (MDAC). The digital outputs of the stages are combined and time-aligned to yield a high-speed, high throughput, and, often, high resolution converter. One drawback of the pipelined ADC is higher latency than a single stage flash ADC of the same resolution.

One or more circuit impairments in a pipelined ADC may cause inter-stage amplifier gain errors and memory errors in the MDAC. Memory errors may be caused by, for example, capacitor dielectric relaxation/absorption and incomplete resetting of the inter-stage amplifier and sub-DAC. There are several known ADC background calibration techniques. However, to avoid clipping the ADC, the ADC input amplitude may have to be reduced during periods when a training signal is injected. This may lead to loss of information, and cause performance degradation. Calibration may be performed in the foreground, but this interrupts normal ADC operation. Increasing the size of the circuitry may also improve ADC performance, but this may require significant chip area and power for high resolution pipelined ADCs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
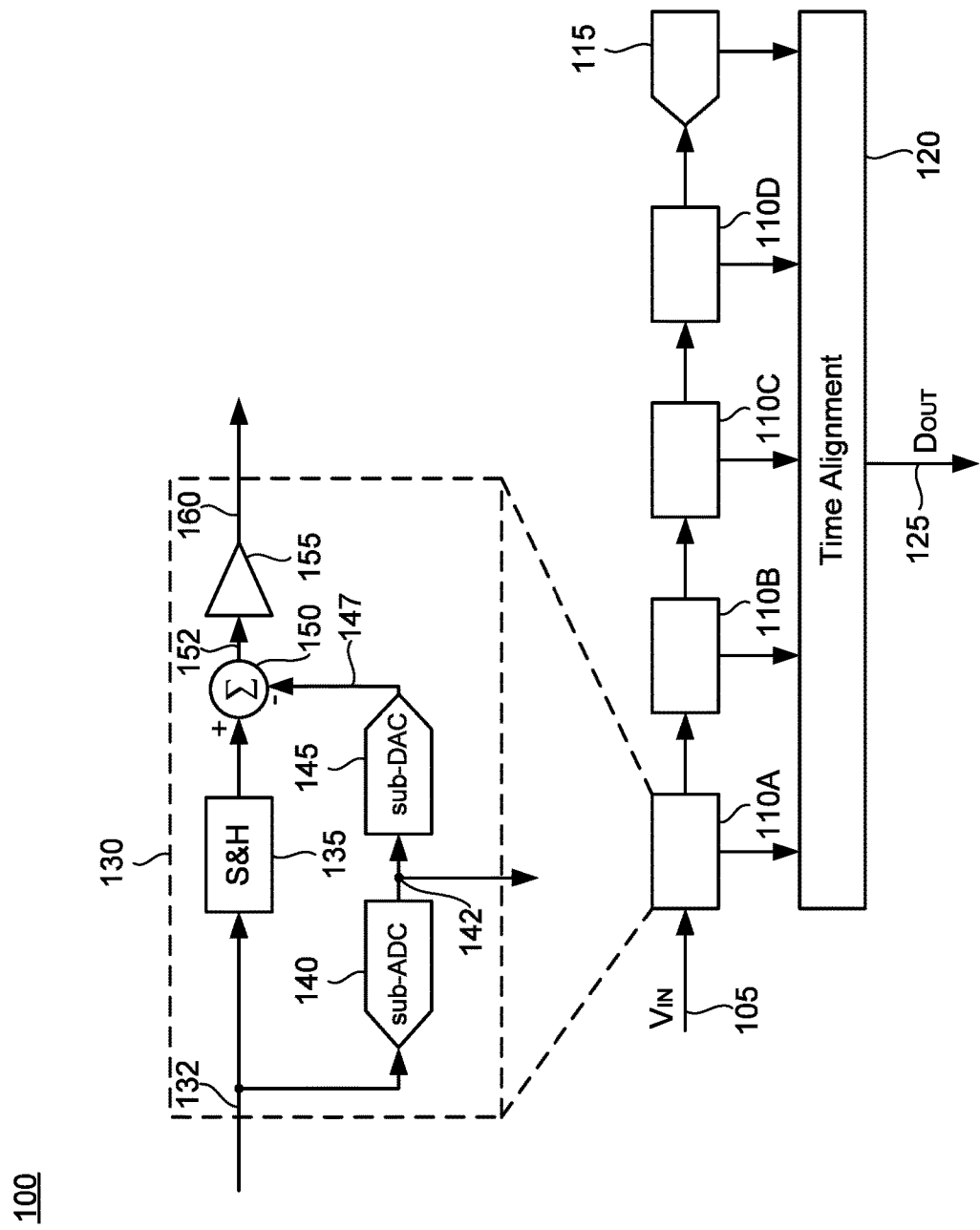
FIG. 1 illustrates a pipelined ADC according to some embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include an adaptive background calibrating pipelined ADC.

FIG. 1 illustrates a pipelined ADC 100 according to some embodiments of the present disclosure. In pipelined ADC 100, an input voltage V N 105 may be applied to the first stage 110A of the pipelined ADC 100. Each of the stages 110A-110D may include circuitry depicted in the exploded view of each stage 130. Within each stage 130, the input voltage 132 may be fed to a sample-and-hold circuit 135 and to sub-ADC 140. Sub-ADC 140 may convert the input voltage 132 to a digital output 142. In some embodiments, sub-ADC 140 may be a flash ADC with a resolution less than the resolution of the pipelined ADC 100 overall (common sub-ADC resolutions may be from 1 to 4 bits, but higher resolution sub-ADCs may be useful in some applications). This provides a coarse conversion of the input voltage 132 to digital output 142. The digital output 142 of sub-ADC 140 may be fed to time-alignment circuit 120 and also to sub-DAC 145, where it may be converted to an analog voltage 147. Analog voltage 147 may then be subtracted from the held version of the input voltage 132 in analog summing circuit 150 to yield a residue 152 (sometimes called a remainder). The residue 152 therefore represents the difference between the input voltage 132 and the coarsely quantized version of input voltage 132. The residue 152 may be amplified by amplifier 155 to produce an output voltage 160, which may be fed to the next stage (110B-110D) or to the final stage sub-ADC 115. The functions of the sub-DAC 145, the analog summing circuit 150, the amplifier 155, and, possibly, the sample-and-hold circuit 135 may be combined into an MDAC. The digital outputs for each of the stages 110A-110D, and the final stage sub-ADC 115, are fed into time alignment circuit 120 where the digital data is time aligned and assembled into a final digital output 125.

While FIG. 1 illustrates a pipelined ADC with four identical stages (110A-110D) plus a final stage that includes only a sub-ADC (115), those skilled in the art will readily appreciate that a pipelined ADC with any number of stages may be implemented without departing from the basic functionality of the pipelined ADC.

Figure 2:
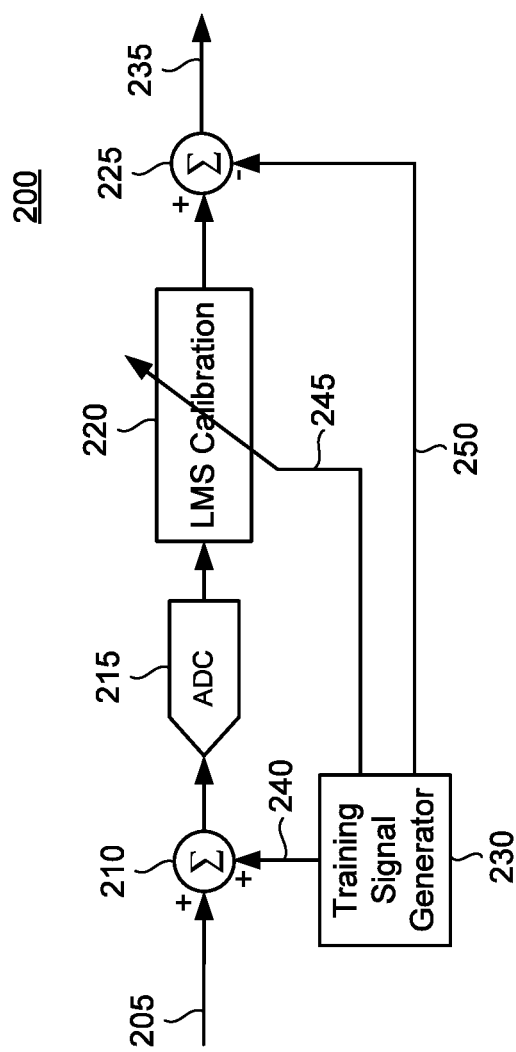
FIG. 2 illustrates a simplified functional block diagram of an ADC calibration system according to an embodiment of the present disclosure.

FIG. 2 illustrates a simplified functional block diagram 200 of an ADC calibration system according to an embodiment of the present disclosure. Referring now to FIG. 2, an analog input signal 205 may be provided to one input of first summing circuit 210. The output of first summing circuit 210 may be input to ADC 215. ADC 215 may, in some embodiments, be a pipelined ADC. The output of ADC 215 may be input to LMS calibration function 220. In some embodiments, LMS calibration function 220 may include an adaptive digital filter based on a least mean squares (LMS) algorithm to adjust the tap weights of the adaptive digital filter. The adaptive digital filter may correct for, or reduce the effects of, for example, one or more circuit impairments in ADC 215. The output of LMS calibration function 220 may be provided to one input of second summing circuit 225. The output 235 of second summing circuit 225 may be the (approximate) digital equivalent of the analog input signal 205. Training signal generator 230 may provide a training signal 240 that is added to analog input signal 205 in first summing circuit 210. Training signal generator 230 may also provide a training signal 250 to the second input of second summing circuit 225. Training signal 250 may be identical to training signal 240, the additive inverse of training signal 240, or may be a scaled version of training signal 240, but all with the appropriate delay through ADC 215 and LMS calibration function 220. Training signal generator 230 may also provide adaptation signal 245 to LMS calibration function 220 to facilitate adjustment of the tap weights of the adaptive filter within LMS calibration function 220. In some embodiments, first summing circuit 210 may be implemented as a digital summing circuit (adder) and positioned within ADC 215 after analog input signal 205 is converted to the digital domain.

In the ADC calibration system illustrated in FIG. 2, training signal 240 may be injected along with (at the same time as) the desired analog input signal 205 to ADC 215. The training signal may be removed in the digital domain at second summing circuit 225. The training signal, in this embodiment, may occupy usable ADC dynamic range. In addition, the calibration process may require that the training signal be uncorrelated with the analog input signal 205.

Figure 3:
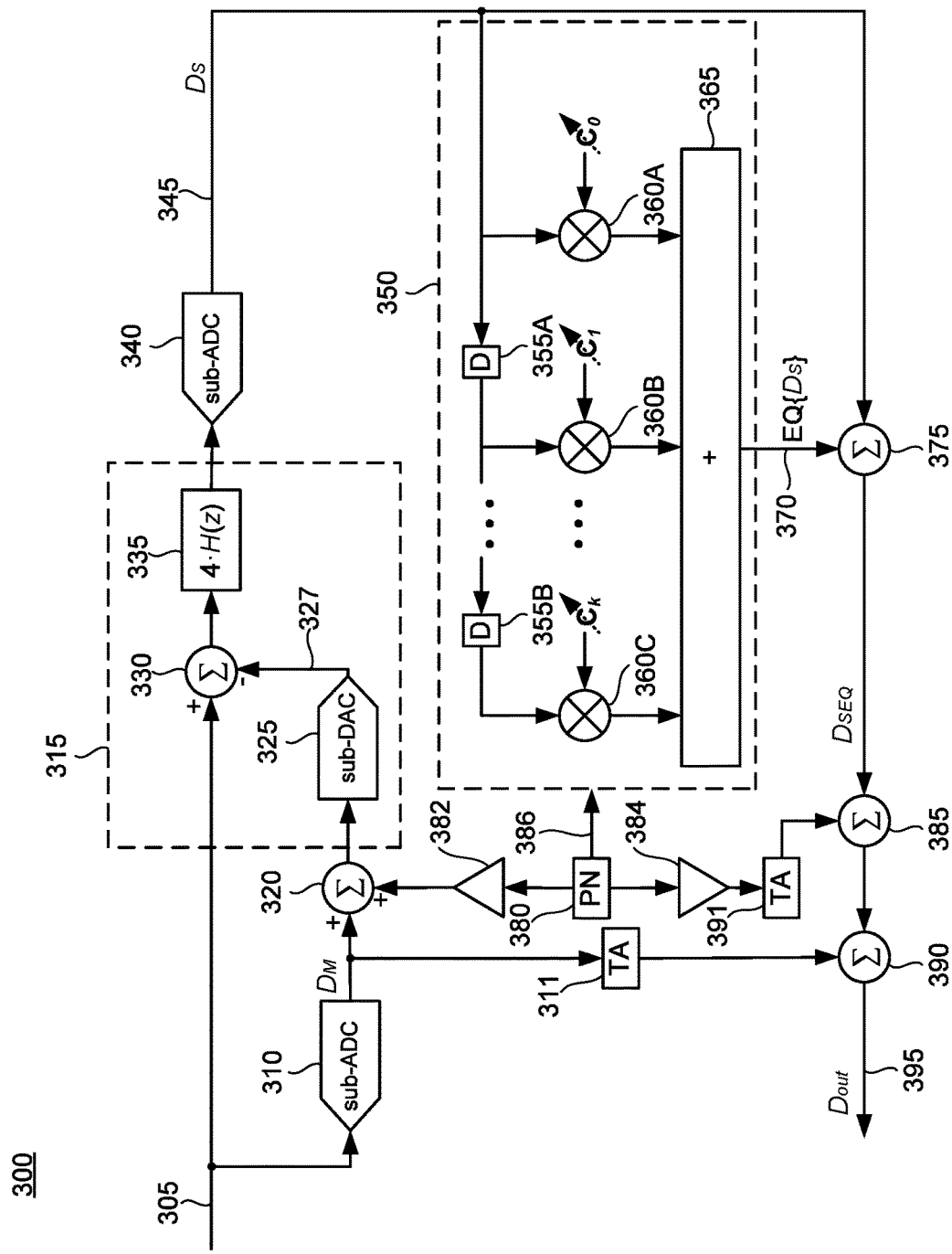
FIG. 3 illustrates a functional block diagram of a 2-stage pipelined ADC incorporating an ADC calibration system according to an embodiment of the present disclosure.

FIG. 3 illustrates a functional block diagram 300 of a 2-stage pipelined ADC, with an ideal inter-stage gain of 4, incorporating an ADC calibration system according to an embodiment of the present disclosure. Referring now to FIG. 3, an analog input signal 305 may be provided to first stage sub-ADC 310 and to summing circuit 330 in first stage MDAC 315. The output of first stage sub-ADC 310 ($D_M$), through time-alignment block 311, may be input to summing circuit 320 and, through time-alignment block 311, to summing circuit 390. Time-alignment block 311 may be required to account for delays through MDAC 315 and FIR MDAC equalizer 350. The output of summing circuit 320 may be input to sub-DAC 325 in first stage MDAC 315. The output 327 of sub-DAC 325 may be input to summing circuit 330. In some embodiments, output 327 of sub-DAC 325 may be subtracted from analog input signal 305 in summing circuit 330 to produce a residue. The output of summing circuit 330 (residue) may be input to first stage amplifier 335. The output of first stage amplifier 335 may be input to second stage sub-ADC 340, whose output is referred to in FIG. 3 as $D_S$ (345). In functional block diagram 300, inter-stage gain errors and memory errors of first stage amplifier 335 may be modeled by an all-pole infinite impulse response (IIR) filter H(z). The inter-stage gain errors and memory errors may be corrected, in some embodiments, in the digital domain by an adaptive finite impulse response (FIR) MDAC equalizer 350. Second stage sub-ADC 340 output $D_S$ 345 may be input to FIR MDAC equalizer 350. Within FIR MDAC equalizer 350, signal $D_S$ 345 may be delayed by one or more delay elements (355A-355B) and multiplied by adjustable coefficients $C_0$-$C_k$ in one or more multipliers (360A-360C). The outputs 360A-360C of multipliers 360A-360C may be summed in summing circuit 365. The output 370 of summing circuit 365 may represent, after adaptation, a correction for the inter-stage gain errors and memory errors of first stage amplifier 335 and may be added to signal $D_S$ 345 in summing circuit 375. The output of summing circuit 375 ($D_{SEQ}$) may be input to a first input of summing circuit 385. In FIG. 3, FIR MDAC equalizer 350 is illustrated with 2 delay elements (355A-355B) and three multipliers 360A-360C, along with ellipses to indicate taps (delay elements and multipliers) not shown. It will be clear to one skilled in the art that FIR MDAC equalizer 350 may include a sufficient number of taps to provide a suitable correction for the inter-stage gain errors and memory errors of amplifier 335.

FIG. 3 also illustrates training signal generator (pseudo-noise generator) 380, which provides a pseudo-random signal, through gain block 382, to a second input of summing circuit 320. This adds a pseudo-random signal from training signal generator 380 to the digitized signal $D_M$ and allows for adaptation of FIR MDAC equalizer 350. The pseudo-random signal from training signal generator 380 may also provide, through gain block 384 and time alignment block 391, a second input to summing circuit 385. This may remove the pseudo-random signal (added to the digitized signal $D_M$ in summing circuit 320) from the equalized (corrected) signal $D_{SEQ}$. The output of summing circuit 385 may be provided to a second input of summing circuit 390, where it may be added to the time-aligned version of digitized signal $D_M$ to produce the final digitized output Dour 395. Training signal generator 380 may also provide a signal 386 to FIR MDAC equalizer 350 for use in the adaptation process. Time-alignment blocks 311 and 391 may be required, in some embodiments, to account for delays through MDAC 315 and FIR MDAC equalizer 350.

Figure 4:
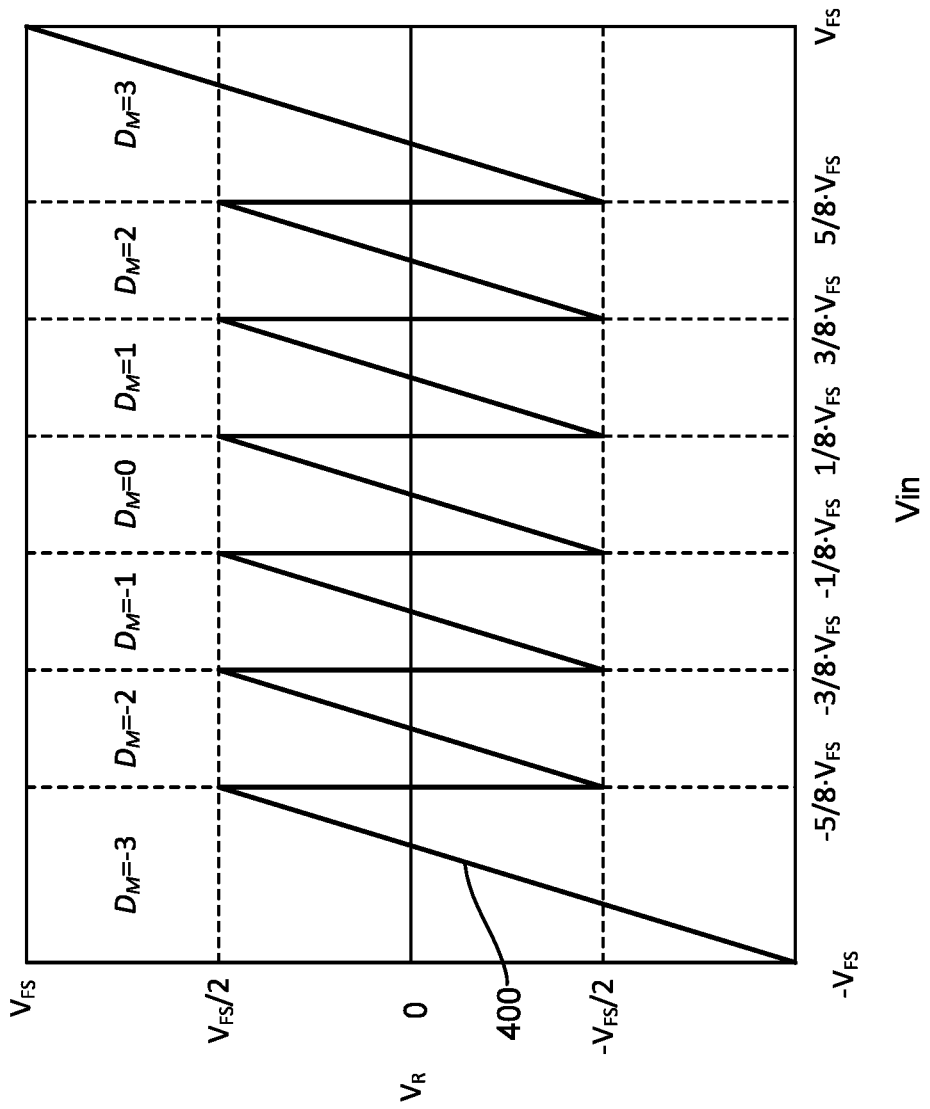
FIG. 4 illustrates a residue plot of a Multiplying DAC (MDAC) that may be used in a pipelined ADC stage according to an embodiment of the present disclosure.

FIG. 4 illustrates an ideal residue plot 400 ($V_R$ vs. $V_{in}$) of a 2.5-bit Multiplying DAC (MDAC) that may be used in a pipelined ADC stage with ideal amplifier gain of 4.

Figure 5:
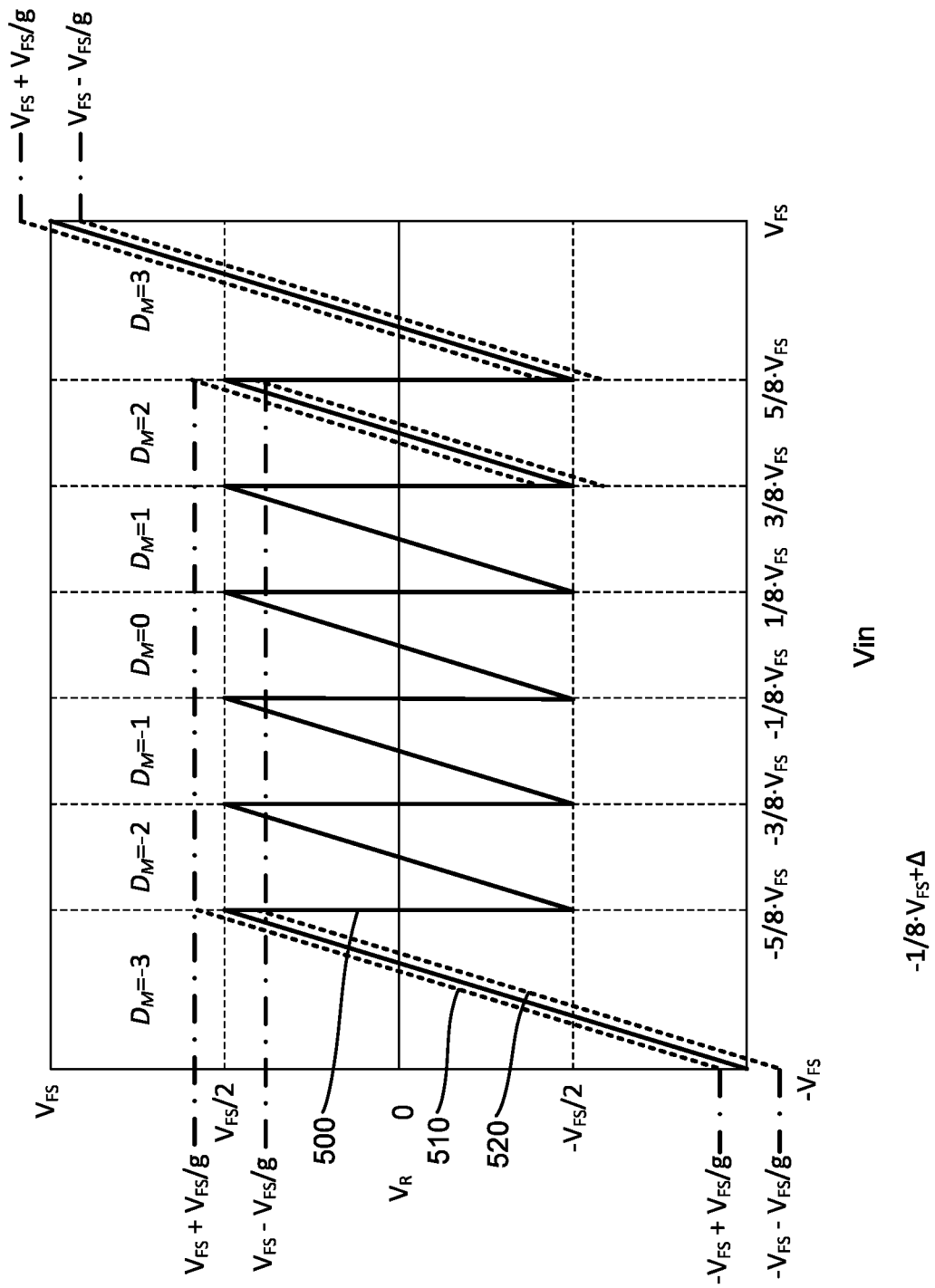
FIG. 5 illustrates another residue plot of a Multiplying DAC (MDAC) that may be used in a pipelined ADC stage according to an embodiment of the present disclosure.

FIG. 5 illustrates another residue plot 500 ($V_R$ vs. $V_{in}$) of a 2.5-bit Multiplying DAC (MDAC) that may be used in a pipelined ADC stage with ideal amplifier gain of 4. FIG. 5 illustrates how injection of a pseudo-random signal can increase the MDAC gain stage output swing. If a pseudo-random signal is injected at a level of $V_{FS}/(4 \cdot g)$ when the input voltage ($V_{in}$) is in the outer-most segments (e.g. $D_M=+/-3$ in FIG. 5), then the residual amplitude ($V_R$) may exceed the full-scale range ($V_{FS}$) of the second stage ADC. To avoid amplitude clipping (which leads to loss of information), the input amplitude may have to be reduced from its full scale range during background calibration.

Figure 6:
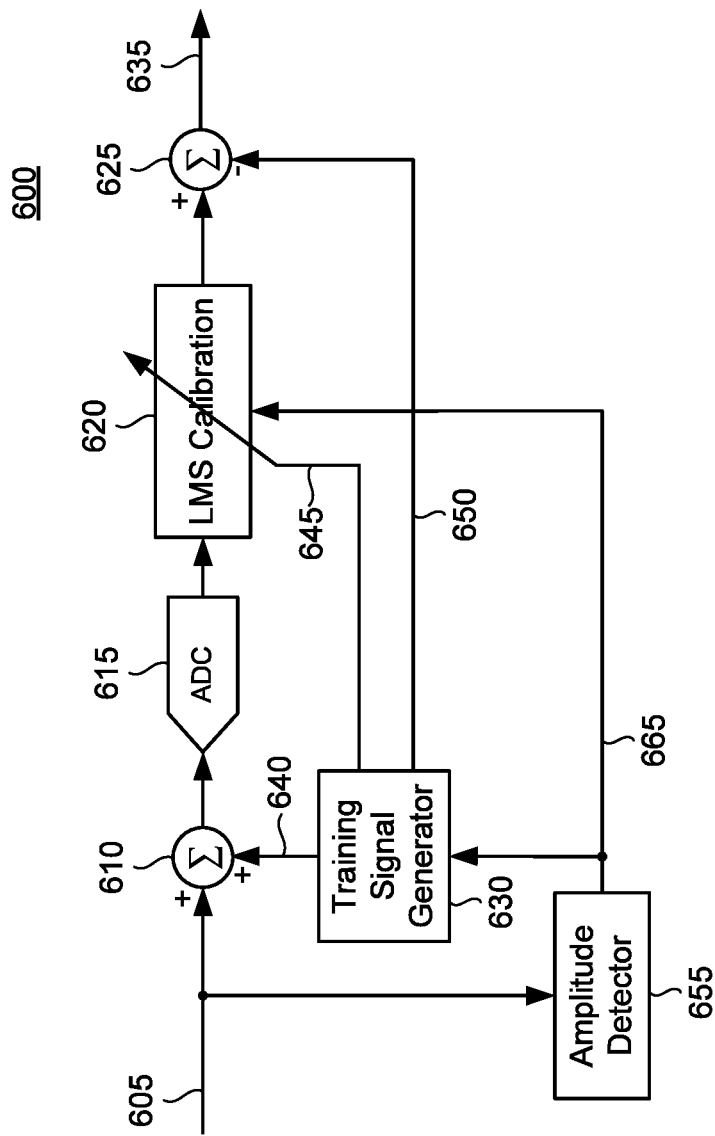
FIG. 6 illustrates a simplified functional block diagram of an ADC calibration system according to some embodiments of the present disclosure.

FIG. 6 illustrates a simplified functional block diagram 600 of an ADC calibration system according to some embodiments of the present disclosure. Referring now to FIG. 6, an analog input signal 605 may be provided to one input of first summing circuit 610 and to amplitude detector 655. The output of first summing circuit 610 may be input to ADC 615. ADC 615 may, in some embodiments, be a pipelined ADC. The output of ADC 615 may be input to LMS calibration function 620. In some embodiments, LMS calibration function 620 may include an adaptive digital filter based on a least mean squares (LMS) algorithm to adapt the tap weights of the adaptive digital filter. The adaptive digital filter may reduce the effects of, for example, one or more circuit impairments in ADC 615. In particular, the adaptive digital filter in LMS calibration function 620 may provide a correction for inter-stage gain errors and memory errors of one or more inter-stage amplifiers in ADC 615. The output of LMS calibration function 620 may be provided to one input of second summing circuit 625. The output 635 of second summing circuit 625 may be the (approximate) digital equivalent of the analog input signal 605. Training signal generator 630 may provide a training signal 640 that is added to analog input signal 605 in first summing circuit 610. Training signal generator 630 may also provide a training signal 650 to the second input of second summing circuit 625. Training signal 650 may be identical to training signal 640, the additive inverse of training signal 640, or may be a scaled version of training signal 640, but all with the appropriate delay through ADC 615 and LMS calibration function 620. Training signal generator 630 may also provide adaptation signal 645 to LMS calibration function 620 to facilitate adaptation of the tap weights of the adaptive filter within LMS calibration function 620. In some embodiments, first summing circuit 610 may be implemented as a digital summing circuit (adder) and positioned within ADC 615 after analog input signal 605 is converted to the digital domain. Amplitude detector 655 may detect the amplitude of analog input signal 605 and provide output signal 665 to training signal generator 630 and LMS calibration function 620. In some embodiments, signal 665 may indicate when analog input signal 605 is above a predetermined threshold value. Training signal generator 630 and LMS calibration function 620 may use signal 665 to determine when the amplitude of analog input signal 605 is too large for injection of training signal 640 (for example, when amplitude clipping may occur). In some embodiments, amplitude detector 655 may be a flash ADC. If, for example, the input amplitude produced by a flash ADC is in the outer segments of the MDAC, then the training signal 640 may be disabled. In such embodiments, the background calibration may be temporarily suspended and the calibration coefficients may not be updated. In addition, the training signal may not need to be removed if the training signal injection is disabled. In some embodiments, the adaptive (amplitude sensitive) background calibration described above may be applied to each stage of a pipelined ADC.

In the ADC calibration system illustrated in FIG. 6, training signal 640 may be injected along with (at the same time as) the desired analog input signal 605 to ADC 615. The training signal may be removed in the digital domain at second summing circuit 625. The training signal, in this embodiment, may occupy usable ADC dynamic range. In addition, the calibration process may require that the training signal be uncorrelated with the analog input signal 605.

Figure 7:
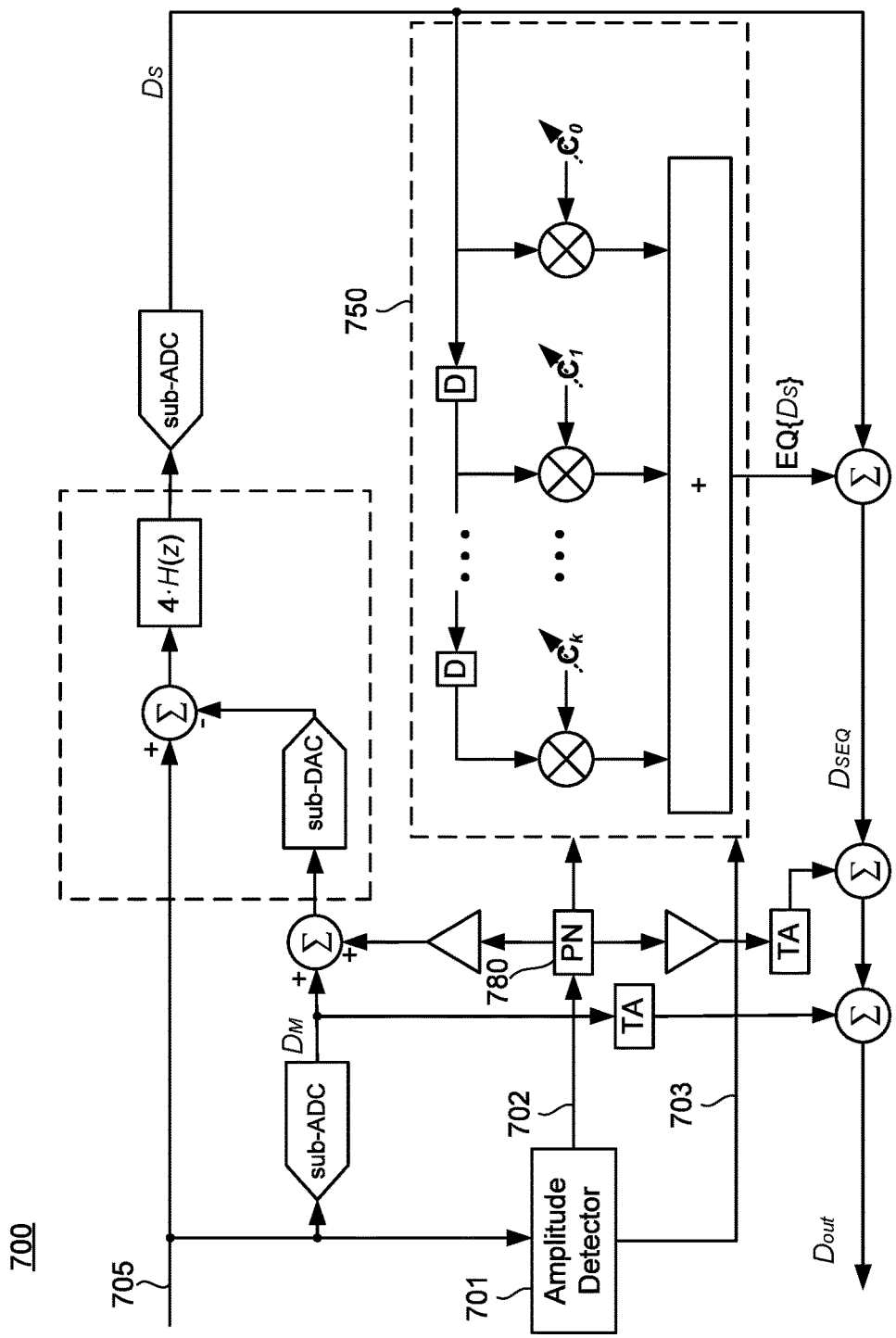
FIG. 7 illustrates another functional block diagram of a 2-stage pipelined ADC incorporating an ADC calibration system according to some embodiments of the present disclosure.

FIG. 7 illustrates a functional block diagram 700 of a 2-stage pipelined ADC, with an inter-stage gain of 4, incorporating an ADC calibration system according to some embodiments of the present disclosure. The 2-stage pipelined ADC illustrated in FIG. 7 is similar to the 2-stage pipelined ADC illustrated in FIG. 3, with the addition of amplitude detector 701. In the 2-stage pipelined ADC illustrated in FIG. 7, amplitude detector 701 receives analog input signal 705. Amplitude detector 701 may detect the amplitude of analog input signal 705 and provide output signal 702 to training signal generator 780 and output signal 703 to FIR MDAC equalizer 750. In some embodiments, signals 702 and 703 may indicate when analog input signal 705 is above a predetermined threshold value. Training signal generator 780 and FIR MDAC equalizer 750 may use signals 702 and 703 to determine when the amplitude of analog input signal 705 is too large for injection of a training signal (for example, when amplitude clipping may occur). In some embodiments, amplitude detector 701 may be a flash ADC. If analog input signal 705 is too large for injection of a training signal (above the predetermined threshold value), then the training signal generator 780 may be disabled. In such embodiments, the background calibration may be temporarily suspended and the calibration coefficients may not be updated. In addition, the training signal may not need to be removed if the training signal generator 780 is disabled. In some embodiments, the input to amplitude detector 701 may be digitized signal $D_M$, instead of analog input signal 705, which may significantly simplify the circuitry of amplitude detector 701.

Figure 8:
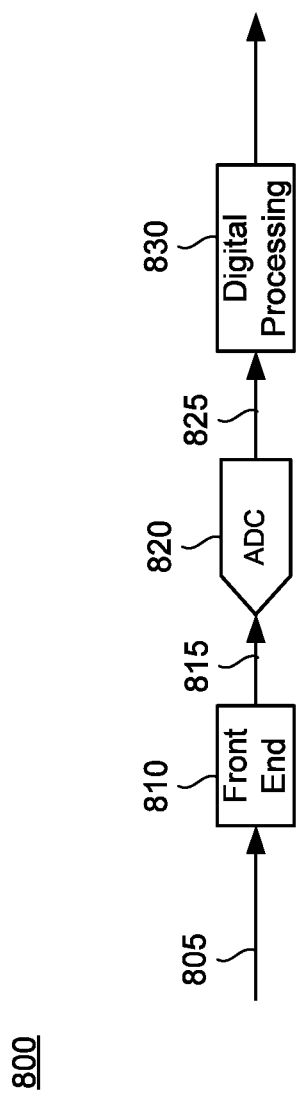
FIG. 8 illustrates a simplified functional block diagram of one class of applications (communication receiver) for an ADC with adaptive background calibration like that described in the present disclosure.

FIG. 8 illustrates a simplified functional block diagram of one class of applications (communication receiver 800) for an ADC with adaptive background calibration like that disclosed above. Communication receiver 800 may be part of a bidirectional communication system that may include a transmitter (not shown), or may be part of a stand-alone receiver (such as a broadcast television or radio receiver). In FIG. 8, an analog input signal 805 from, for example, an antenna, a coaxial cable, a fiber optic cable, a twisted pair cable, is fed into a front end circuit 810. Analog input signal 805 may be an RF or other high frequency carrier modulated with analog or digital information. Front end circuit 810 may include one or more low-noise amplifiers, tuners, mixers, filters, and the like. The output 815 from front end circuit 810 may be a baseband or intermediate frequency analog signal. The output 815 from front end circuit 810 may be fed into ADC 820 for conversion to digital form. ADC 820 may include adaptive background calibration circuitry to correct for or reduce one or more circuit impairments. Digital output 825 from ADC 820 may be fed into digital processing circuitry 830 for further processing in the digital domain.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

The invention claimed is:

1. An electronic device comprising:
an analog-to-digital converter circuit configured to receive an input signal;
an adaptive filter circuit coupled to a digital output of the analog-to-digital converter circuit, the adaptive filter circuit configurable to correct one or more circuit impairments in the analog-to-digital converter circuit;
a training signal generator circuit coupled to the analog-to-digital converter circuit and the adaptive filter circuit, the training signal generator circuit configured to generate at least one training signal, the analog-to-digital converter circuit configured to add one of the at least one training signals to the input signal, and the adaptive filter circuit configured to use one of the at least one training signals to adjust one or more adaptive filter coefficients; and
an amplitude detector circuit coupled to the training signal generator circuit and the adaptive filter circuit and configured to receive the input signal and cause the training signal generator circuit to suspend generation of the at least one training signal and cause the adaptive filter circuit to suspend adaptation of the one or more adaptive filter coefficients when the input signal is above a predetermined threshold.

2. The electronic device of claim 1, wherein the analog-to-digital converter circuit is a pipelined analog-to-digital converter comprising two or more stages, and wherein each stage but a last stage comprise:
a sub-analog-to-digital converter circuit (sub-ADC);
a summing circuit coupled to the sub-ADC; and
a multiplying digital-to-analog-converter (MDAC) circuit coupled to the summing circuit.

3. The electronic device of claim 2, wherein the one or more circuit impairments includes gain errors and memory errors in the MDAC of at least one of the two or more stages of the analog-to-digital converter circuit.

4. The electronic device of claim 1, wherein the adaptive filter circuit is a finite impulse response (FIR) equalizer.

5. The electronic device of claim 1, wherein one of the at least one training signal is a pseudo-random signal.

6. The electronic device of claim 1, further comprising a summing circuit coupled to an output of the adaptive filter circuit and to the training signal generator circuit, where the summing circuit is configured to subtract one of the at least one training signal generated by the training signal generator circuit from the output of the adaptive filter circuit.

7. The electronic device of claim 1, wherein the amplitude detector circuit is a flash ADC.

8. A communication receiver comprising:
a front-end circuit;
an analog-to-digital converter circuit configured to receive an input signal from the front end circuitry;
an adaptive filter circuit coupled to a digital output of the analog-to-digital converter circuit, the adaptive filter circuit configurable to correct one or more circuit impairments in the analog-to-digital converter circuit;
a training signal generator circuit coupled to the analog-to-digital converter circuit and the adaptive filter circuit, the training signal generator circuit configured to generate at least one training signal, the analog-to-digital converter circuit configured to add one of the at least one training signals to the input signal, and the adaptive filter circuit configured to use one of the at least one training signals to adjust one or more adaptive filter coefficients; and
an amplitude detector circuit coupled to the training signal generator circuit and the adaptive filter circuit and configured to receive the input signal and cause the training signal generator circuit to suspend generation of the at least one training signal and cause the adaptive filter circuit to suspend adaptation of the one or more adaptive filter coefficients when the input signal is above a predetermined threshold.

9. The communication receiver of claim 8, wherein the analog-to-digital converter circuit is a pipelined analog-to-digital converter comprising two or more stages, and wherein each stage but a last stage comprise:
a sub-analog-to-digital converter circuit (sub-ADC);
a summing circuit coupled to the sub-ADC; and
a multiplying digital-to-analog-converter (MDAC) circuit coupled to the summing circuit.

10. The communication receiver of claim 8, wherein the one or more circuit impairments includes gain errors and memory errors in the MDAC of at least one of the two or more stages of the analog-to-digital converter circuit.

11. The communication receiver of claim 8, wherein the adaptive filter circuit is a finite impulse response (FIR) equalizer.

12. The communication receiver of claim 8, wherein one of the at least one training signal is a pseudo-random signal.

13. The communication receiver of claim 8, further comprising a summing circuit coupled to an output of the adaptive filter circuit and to the training signal generator circuit, where the summing circuit is configured to subtract one of the at least one training signal generated by the training signal generator circuit from the output of the adaptive filter circuit.

14. The communication receiver of claim 8, wherein the amplitude detector circuit is a flash ADC.

15. A pipelined analog-to-digital converter comprising:
a first stage sub-analog-to-digital converter circuit (sub-ADC) configured to receive an input signal;
a first stage summing circuit coupled to a digital output of the first stage sub-ADC;
a first stage multiplying digital-to-analog-converter circuit (MDAC) coupled to the summing circuit and configured to receive the input signal;
a second stage sub-ADC coupled to the first stage MDAC;
an adaptive filter circuit coupled to a digital output of the second stage sub-ADC, the adaptive filter circuit configurable to correct one or more circuit impairments in the first stage MDAC;
a training signal generator circuit coupled to the first stage summing circuit and the adaptive filter circuit, the training signal generator circuit configured to generate at least one training signal, the summing circuit configured to add one of the at least one training signals to the digital output of the first stage sub-ADC, and the adaptive filter circuit configured to use one of the at least one training signals to adjust one or more adaptive filter coefficients; and
an amplitude detector circuit coupled to the training signal generator circuit and the adaptive filter circuit and configured to receive the input signal and cause the training signal generator circuit to suspend generation of the at least one training signal and cause the adaptive filter circuit to suspend adaptation of the one or more adaptive filter coefficients when the input signal is above a predetermined threshold.

16. The pipelined analog-to-digital converter of claim 15, wherein the one or more circuit impairments includes gain errors and memory errors in the first stage MDAC.

17. The pipelined analog-to-digital converter of claim 15, wherein the adaptive filter circuit is a finite impulse response (FIR) equalizer.

18. The pipelined analog-to-digital converter of claim 15, wherein one of the at least one training signal is a pseudo-random signal.

19. The pipelined analog-to-digital converter of claim 15, further comprising a summing circuit coupled to an output of the adaptive filter circuit and to the training signal generator circuit, where the summing circuit is configured to subtract one of the at least one training signal generated by the training signal generator circuit from the output of the adaptive filter circuit.

20. The pipelined analog-to-digital converter of claim 15, wherein the amplitude detector circuit is a flash ADC.

\* \* \* \* \*